United States Patent
Hersman et al.

(10) Patent No.: US 9,780,522 B2
(45) Date of Patent: Oct. 3, 2017

(54) SCALABLE DIODE LASER SOURCE FOR OPTICAL PUMPING

(71) Applicant: University of New Hampshire, Durham, NH (US)

(72) Inventors: F. William Hersman, Durham, NH (US); Jan Distelbrink, Peabody, MA (US)

(73) Assignee: University of New Hampshire, Durham, NH (US)

( * ) Notice: Subject to any disclaimer, the term of this patent is extended or adjusted under 35 U.S.C. 154(b) by 0 days.

(21) Appl. No.: 14/075,360

(22) Filed: Nov. 8, 2013

(65) Prior Publication Data

US 2014/0133515 A1    May 15, 2014

Related U.S. Application Data

(60) Provisional application No. 61/726,137, filed on Nov. 14, 2012.

(51) Int. Cl.
*H01S 3/09* (2006.01)
*H01S 3/0941* (2006.01)
*H01S 5/40* (2006.01)

(52) U.S. Cl.
CPC .......... *H01S 3/0941* (2013.01); *H01S 5/4062* (2013.01); *H01S 5/4068* (2013.01); *H01S 5/405* (2013.01)

(58) Field of Classification Search
CPC ............. H01S 3/2383; H01S 5/42; H01S 5/50
USPC .................................... 372/69, 50.12, 29.016
See application file for complete search history.

(56) References Cited

U.S. PATENT DOCUMENTS

| 6,022,114 A | * | 2/2000 | Foo ............................... 359/853 |
| 6,356,574 B1 | * | 3/2002 | Craig et al. .................... 372/75 |
| 7,184,621 B1 | * | 2/2007 | Zhu ................................ 385/24 |
| 7,769,068 B2 | | 8/2010 | Hersman et al. |
| 7,940,819 B2 | * | 5/2011 | Takabayashi et al. .......... 372/20 |
| 2006/0092994 A1 | * | 5/2006 | Frankel et al. ................. 372/18 |
| 2007/0002925 A1 | * | 1/2007 | Zediker et al. ................. 372/98 |
| 2010/0040098 A1 | * | 2/2010 | Parent et al. ............ 372/29.021 |
| 2010/0110556 A1 | * | 5/2010 | Chann et al. ................. 359/619 |

OTHER PUBLICATIONS

Scalable Pump Source for Diode Pumped Alkali Laser, Proposal to Missile Defense Agency (MDA) Advanced Technology Innovation, Solicitation No. HQ0147-11-ATI-BAA, Aug. 2, 2012.
Scalable Pump Source for Diode Pumped Alkali Laser, Herman, B.; Distelbrink, J. and Watt, D.; Oct. 31, 2012 presentation.

* cited by examiner

*Primary Examiner* — Colleen A Matthews
*Assistant Examiner* — Vu A Vu
(74) *Attorney, Agent, or Firm* — Devine, Millimet & Branch; Paul C. Remus (57) ABSTRACT

The system and method for modifying the output beam parameters of a plurality of laser diode array sources comprises scalable pump sources for use with diode pumped alkali lasers. The present invention optimizes a diode laser pump source by spectrally-narrowing stacks of diode laser array bars using a single external cavity outfitted with a proprietary step-mirror and cylindrical optical elements. The system and method of the present invention multiplies by one-hundred fold the number of stacks that can be narrowed, vastly increasing the attainable power output by utilizing beam-splitters.

16 Claims, 9 Drawing Sheets

SCALABLE DIODE LASER SOURCE FOR OPTICAL PUMPING

CROSS-REFERENCE TO RELATED APPLICATIONS

This application claims the benefit of U.S. Provisional Application No. 61/726,137, filed Nov. 14, 2012, the content of which is incorporated by reference herein in its entirety.

FIELD OF THE INVENTION

The present invention relates to diode laser light sources for optical pumping and more particularly to scalable pump sources for use with laser diode pumped lasers, including diode pumped alkali vapor lasers.

BACKGROUND OF THE INVENTION

Diode lasers provide inexpensive, high-efficiency production of laser light in the near infrared spectrum. This laser light has a number of uses. Optical pumping of laser amplifier material with several diode array bars can be used for producing a single high-quality laser beam from the separate beams of the diode array. One promising avenue for producing a single high-quality very high power laser beam is the use of diode pumping of alkali metal vapor, a Diode Pumped Alkali Laser (DPAL).

The efficiency and productivity of these applications require that the individual diode bar pump beams be prepared with optimal properties, such as stable central wavelength, narrow linewidth, low divergence, and uniform intensity.

Applicant in U.S. Pat. No. 7,769,068, incorporated herein by reference in its entirety, describes a system to increase the brightness of, and control gaps in, the light from an external cavity, spectrally narrowed, stack of diode laser bars by employing a stepped mirror, transparent plates, or some combination thereof in the external cavity.

The present invention addresses shortcomings in the art by providing scalable pump sources for optimizing a diode laser pump source. The laser design of the present invention advances Applicants' previous work for spectrally-narrowing stacks of diode laser array bars using a single external cavity outfitted with a proprietary step-mirror. In particular, the present invention can achieve a higher intensity of spectrally-narrowed, low-divergence output of a larger number of laser diode bars. In order to achieve high quality, high-intensity output beams, the light that is amplified in the single-stripe diode can be customized by arranging external optical elements to inject seed photons from the external cavity into the diode, and lock the wavelength and narrow the slow axis divergence. The system and method of the present invention multiplies by twenty, fifty, one-hundred fold or more the number of stacks that can be used in the pump laser system, vastly increasing the attainable power output.

SUMMARY OF THE INVENTION

One aspect of the present invention is a method for modifying the output beam parameters of a plurality of laser diode array sources, comprising: utilizing a single external cavity; directing a plurality of output beams from a plurality of laser diodes through a power splitting array comprising a plurality of reflective or partially reflective elements; merging the plurality of output beams from the separate laser diode array sources; directing the resultant beams towards the external cavity; and dividing and distributing the power returning from the external cavity thereby serving the plurality of laser diode array sources with seed photons for laser amplification.

One embodiment of the method for modifying the output beam parameters of a plurality of laser diode array sources is wherein the plurality of laser diode array sources is represented by stacks of laser diode array bars.

One embodiment of the method for modifying the output beam parameters of a plurality of laser diode array sources is wherein the reflective or partially reflective elements are oriented at about 45° with respect to the merged beam propagating toward the external cavity.

One embodiment of the method for modifying the output beam parameters of a plurality of laser diode array sources further comprises the step of providing correction plates custom fitted for the plurality of laser diode array sources, wherein the correction plates are fabricated to improve the similarity of the illumination patterns of the beams from the separate laser diode array sources.

One embodiment of the method for modifying the output beam parameters of a plurality of laser diode array sources further comprises the step of equalizing the optical path length between the plurality of sources and the external cavity.

One embodiment of the method for modifying the output beam parameters of a plurality of laser diode array sources is wherein the number of laser diode array sources is N and the number of partially reflective elements is N−1.

One embodiment of the method for modifying the output beam parameters of a plurality of laser diode array sources is wherein a first laser diode array source initiates a beam in the transverse direction toward the external cavity, and this beam and a second diode array source impinge on two sides of a power splitter, such that ½ the power in each beam is reflected towards the external cavity and half is directed toward the system's output.

One embodiment of the method for modifying the output beam parameters of a plurality of laser diode array sources is wherein a third laser diode array source would have ⅓ of its beam reflected toward the external cavity, and so on.

One embodiment of the method for modifying the output beam parameters of a plurality of laser diode array sources is wherein the number of laser diode array sources is N, the number of reflective or partially reflective elements is N−1, and there is a single turning mirror.

One embodiment of the method for modifying the output beam parameters of a plurality of laser diode array sources is wherein a first laser diode array source has the power in its beam fully reflected toward the external cavity, and a second diode array source has ½ the power in its beam reflected towards the external cavity.

One embodiment of the method for modifying the output beam parameters of a plurality of laser diode array sources is wherein a third laser diode array source would have ⅓ of its beam reflected toward the external cavity, and so on.

One embodiment of the method for modifying the output beam parameters of a plurality of laser diode array sources further comprises providing cylindrical optical elements.

One embodiment of the method for modifying the output beam parameters of a plurality of laser diode array sources further comprises modifying the fast-axis and slow-axis beam parameters independently using the cylindrical optical elements.

One embodiment of the method for modifying the output beam parameters of a plurality of laser diode array sources is wherein the cylindrical optical elements are converging elements and form independent afocal telescopes.

One embodiment of the method for modifying the output beam parameters of a plurality of laser diode array sources is wherein the magnification along the fast-axis is greater than the magnification along the slow axis.

One embodiment of the method for modifying the output beam parameters of a plurality of laser diode array sources is wherein the cylindrical optical elements of the fast axis are first diverging and then converging, thereby forming a beam expander.

One embodiment of the method for modifying the output beam parameters of a plurality of laser diode array sources is wherein one or more of the converging or diverging optical elements is an aplanat doublet.

One embodiment of the method for modifying the output beam parameters of a plurality of laser diode array sources further comprises the step of providing a grating at the Littrow angle for wavelength selection.

One embodiment of the method for modifying the output beam parameters of a plurality of laser diode array sources further comprises the step of providing an etalon for wavelength selection.

One embodiment of the method for modifying the output beam parameters of a plurality of laser diode array sources further comprises the step of providing an aperture in the external cavity to limit the divergence of the slow axis.

Another aspect of the present invention is a method for interchanging the last axis and slow axis of a beam from a diode laser, comprising: providing two or more turning mirrors, wherein the two or more turning mirrors deflect a beam from a diode laser to propagate along all three orthogonal directions, providing a 90° rotation of the illumination pattern.

Another aspect of the present invention is a method for interchanging the fast axis and slow axis of more than one diode laser beams, comprising: providing two turning mirrors for rotation of one such beam and four turning mirrors for rotation of another, wherein the turning mirrors are arranged in a non-interfering geometry, providing separate 90° rotations of the illumination patterns.

One embodiment of the method for interchanging the fast axis and slow axis of a beam from a diode laser further comprises the steps of: providing M sets of axis-rotating turning mirrors; and rotating the fast and slow axes of the laser beams from groups of N bars, wherein the stack of diode array bars comprises N×M bars.

These aspects of the invention are not meant to be exclusive and other features, aspects, and advantages of the present invention will be readily apparent to those of ordinary skill in the art when read in conjunction with the following description, appended claims, and accompanying drawings.

BRIEF DESCRIPTION OF THE DRAWINGS

The foregoing and other objects, features, and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

The method and system of the present invention optimizes the beam output properties of an array of diode lasers. In particular, it provides for locking of the wavelength, reducing the spectral linewidth, and reducing the divergence of a large number of diode array bars, allowing higher output power to converge on smaller targets than previous arrangements. Embodiments of the present invention can be optimized for optically pumping lasing media, such as delivering a beam centered at 808 nm for pumping Nd:YAG, centered at respective wavelengths for pumping alkali atoms such as 852.3 nm (cesium D2), 780.2 nm (rubidium D2), or 766.7 (potassium D2) for a diode pumped alkali laser, for pumping 894.6 nm (cesium D1), 795 nm (rubidium D1), or 770.1 nm (potassium D1) for spin exchange optical pumping, or for other optical pumping applications.

In one embodiment of the pump laser system of the present invention, the source is comprised of two diode array laser stacks with their individual beams directed at an optical element with one partially reflective surface that serves as a power splitter, such that a portion of the beams from both stacks is directed toward the system's output beam while a portion of the beams from both stacks is directed towards an external cavity. In certain embodiments, the power splitter is oriented to divide in half the angle between the two beams, so that the beams from the separate stacks emerging from the power splitter propagating towards the system's output beam, are merged and the beams emerging and propagating towards the external cavity from the separate stacks are merged. In certain embodiments, the reflectivity of the power splitter is about 50% so that the merged beam propagating toward the system's output is equally composed of light originating from each of the stacks, and the merged beam propagating toward the external cavity is equally composed of light originating from each of the stacks.

In one embodiment of the pump laser system of the present invention, the source is comprised of three diode array laser stacks, an external cavity, two optical elements that serve as power splitters, each with one partially reflective surface. In certain embodiments of the pump laser system of the present invention, the system is configured such that the beam propagating from the stack located farthest from the external cavity is directed generally toward the external cavity, and as such, the beam crosses at the location of the two power splitters with the beams from the other two stacks which are propagating in a direction generally toward the system's output beam. In certain embodiments, the orientation of the power splitters at each beam crossing subtends the angles of the crossing beams, so that the beam emerging from the power splitter propagating towards the external cavity is a merged beam, and each beam propagating towards the system's output is also a merged beam. In some instances the reflectivity of the first power splitter, farthest from the external cavity, is 50% so that the merged beam exiting that power splitter and propagating toward the system's output is equally composed of light originating from each stack that impinged upon it, and the merged beam propagating toward the external cavity is equally composed of light originating from each stack. In some instances the reflectivity of the second power splitter, i.e. second farthest from the external cavity, is 33% so that the merged beam exiting that power splitter and propagating toward the external cavity is equally composed of light originating from each of the three stacks, and so on.

In one embodiment of the pump laser system of the present invention, the source is comprised of N diode array laser stacks, an external cavity, N−1 optical elements that serve as a power splitters, each with one partially reflective surface, configured such that the beam from the stack farthest from the external cavity is directed generally toward the external cavity. The beam form the stack farthest from the external cavity crosses at the location of the N−1 power splitters with the beams from the other N−1 stacks which are propagating in a direction generally toward the system's output beam. In certain embodiments, the orientation of the power splitters at each beam crossing subtends the angles of crossing beams, so that the beam emerging from the power splitter propagating towards the external cavity is a merged beam, and each beam propagating towards the system's output is also a merged beam. In certain embodiments, the reflectivity of the first power splitter, farthest from the external cavity, is 50% so that the merged beam exiting that power splitter and propagating toward the system's output is equally composed of light originating from each stack, and the merged beam propagating toward the external cavity is equally composed of light originating from each stack. In certain embodiments, the reflectivity of the second power splitter, second farthest from the external cavity, is 33% so that the merged beam exiting that power splitter and propagating toward the external cavity is equally composed of light originating from each of the three stacks. In certain embodiments, the reflectivity of the $i^{th}$ power splitter (where i is a number between 1 and N−1), $i^{th}$ farthest from the external cavity, is $1/(i+1)$ so that the merged beam exiting that power splitter and propagating toward the external cavity is equally composed of light originating from each of the contributing i+1 stacks.

In certain embodiments, the beam returning from the external cavity is equally distributed by the power splitters to the separate stacks, so that each stack receives an equal share of beam power from the external cavity. In certain embodiments, the schemes shown in FIGS. 1 and 2 can be extended in a second dimension (out of the page) as geometry allows. In certain embodiments, the "two dimensional array of stacks" are locked with a single external cavity.

Figure 1:
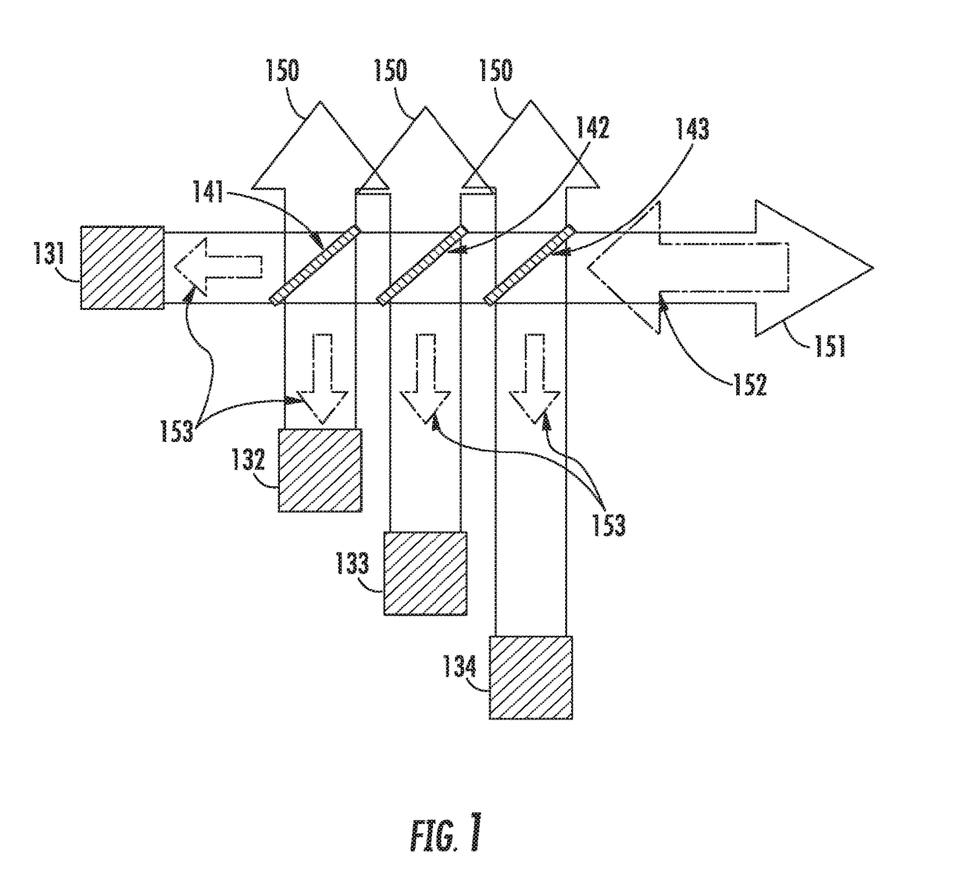
FIG. 1 shows one embodiment of the pump laser system of the present invention.

Referring to FIG. 1, an embodiment of the pump laser system of the present invention is shown. In FIG. 1, the pump laser system in shown with 4 stacks for simplicity. There, the first stack, or the initiator stack 131 is in line with the transverse beam directed toward the external cavity 151. The transverse beam is composed of light from all stacks, is wavelength-locked in an external cavity, and returned. The power returning from the cavity is shown as 152. The other stacks 132, 133, and 134, respectively, are shown in an angled arrangement. This angled arrangement is one possible method of equalizing the path lengths of the multiple stacks present in the pump laser system of the present invention. Still referring to FIG. 1, a plurality of power splitters is shown (i.e. 141, 142, and 143) which are located in the path of the beams from the stacks to the output beam 150. The power splitters, or partial reflectivity, siphon a fraction of this returned power 153 equally into all stacks, all but one of which is geometrically aligned with the output beams 150.

Figure 2:
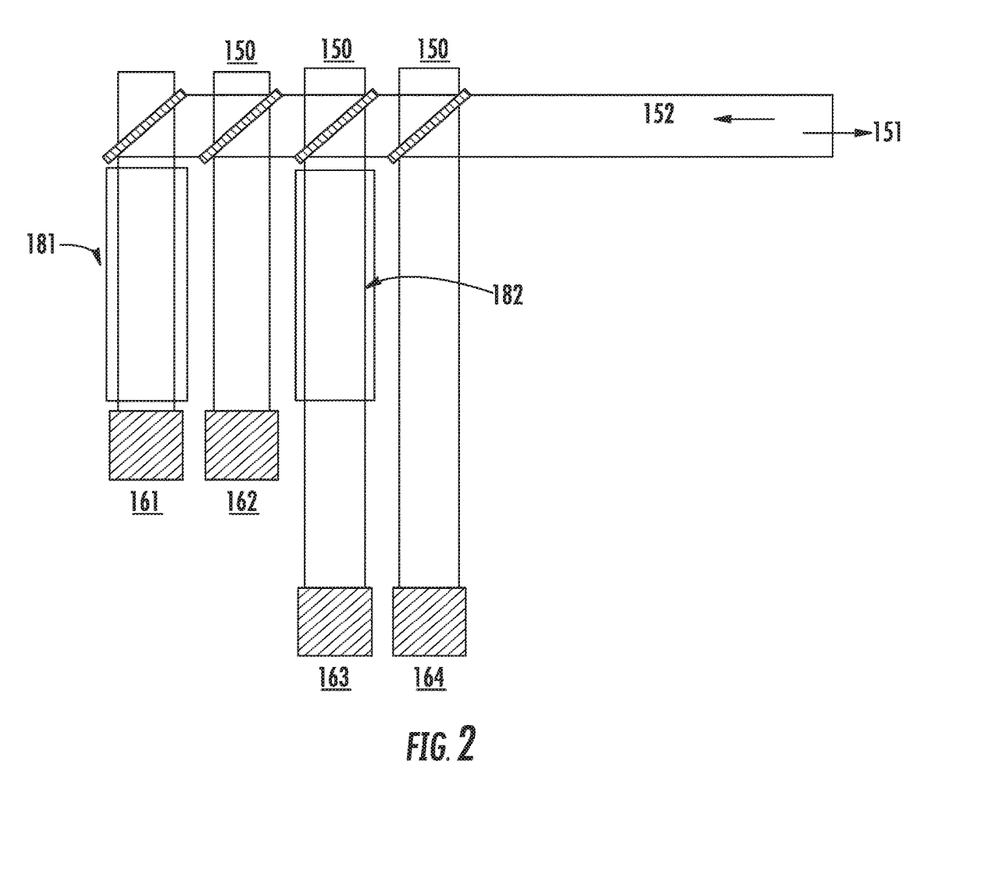
FIG. 2 shows one embodiment of the pump laser system of the present invention.

Referring to FIG. 2, an embodiment of the pump laser system of the present invention is shown. In FIG. 2, the pump laser system in shown with 4 stacks for simplicity. There, the optical path length correction, or equalization, is accomplished partially using glass blocks (i.e. 181 and 182) and partially using geometrical offsets. The transverse beam 151 is composed of light from all stacks, is wavelength-locked in an external cavity, and returned 152. Another modification indicated in FIG. 2 is that the beam from the first stack 161 is reflected by a mirror onto the transverse direction path, rather than originate propagating along that transverse direction. This allows the first stack, 161, to be located, alongside the second stack 162, and the other stacks, 163 and 164, are shown alongside one another as well. This linear arrangement provides for another possible orientation for the stacks and can provide versatility in the design of the pump laser system of the present invention. For example stack 161 and stack 162 may be comprised of a subset of bars from a single physical stack, as may be stack 163 and stack 164. Although turning mirror 171 is fully reflective, the beam splitters, 172-174, are partially reflective and are oriented such that they subtend the angles of the crossing beams to that the teams from the separate stacks emerging from the power splitter towards the system's output beam 150 are merged and the beams emerging towards the external cavity 151 from the separate stacks are merged.

In one embodiment of the pump laser system of the present invention, the components are arranged so that the total optical path lengths (calculated as the sum of partial optical path lengths, each of which is a distance divided by the index of refraction) from the separate stacks to any location in the external cavity are made to be equal, so that optical elements that are chosen for the external cavity to form an image on any stack wilt simultaneously form an image on all stacks. In certain embodiments, the equality of the optical path length is achieved by adjusting the position of the stacks, so that the stacks whose beam first encounters a power splitter farthest from the external cavity are at a location closer to that power splitter, and the stack whose beam first encounters a power splitter close to the external cavity is at a location farther from that power splitter. In certain embodiments, the equality of the optical path length is achieved by inserting one or more additional optical block(s) whose index of refraction is greater than it would have been without the block(s). In certain embodiments, a combination of these and other methods may be employed to adjust the optical path length, as will be apparent to one skilled in the art.

In another embodiment of the pump laser system of the present invention, a turning mirror is utilized for the purpose of redirecting the first beam (farthest from the external cavity) so that it is directed towards the external cavity, allowing all stacks including the first stack to direct their outputs to initially propagate generally in the same direction.

In one embodiment of the pump laser system of the present invention, an external cavity is capable of feeding back laser power with an efficiency that is highest for a selected wavelength and has high efficiency limited to a selected range about that central wavelength. Selection of wavelengths can be accomplished with a diffractive element such as a diffraction grating; with a refractive element such as a prism; with an interference element, such as an interferometer or etalon; or with some combination of wavelength selecting and restricting elements as may be chosen for a particular application by someone skilled in the art.

Figure 3A:
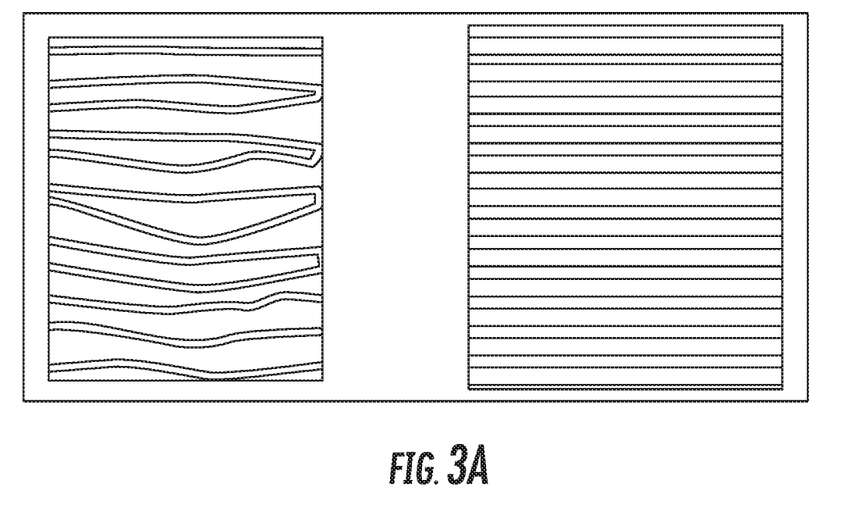
FIG. 3A shows smile reduction utilized in one embodiment of the pump laser system of the present invention.
Figure 3B:
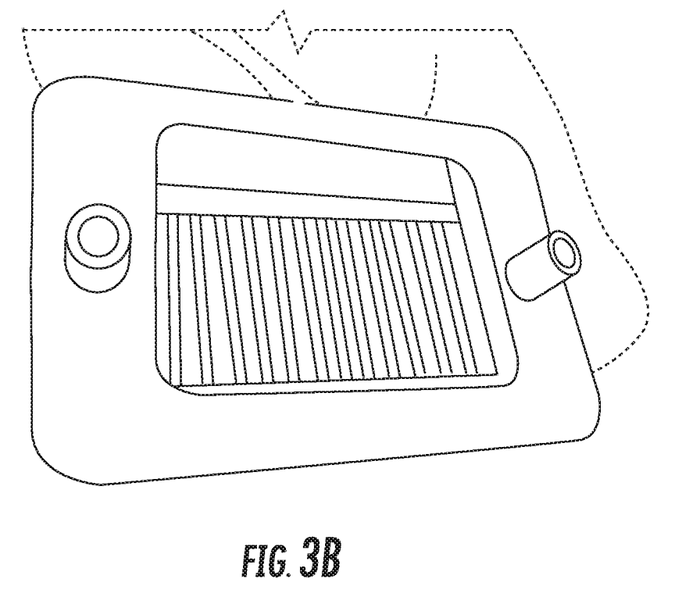
FIG. 3B shows a smile correction plate utilized in one embodiment of the pump laser system of the present invention.

In one embodiment of the pump laser system of the present invention, smile correction is utilized to improve merging of the illumination patterns of the beams from separate stacks. Smile in the output beam of a diode laser bar originates from the manufacturer's inability to produce diode array bars that are perfectly flat. Applicants' own work demonstrated that smile correction can successfully compensate for the variation in the angle impinging on the grating, equalizing the central value of the locked wavelength of each emitter. Smile errors can have detrimental effects on the ability to utilize power sourced from all stacks, wavelength selected by the external cavity, to return through power splitters to serve as seed photons and lock the wavelength of all stacks. Referring to FIG. 3A, in one embodiment of the pump laser system of the present invention a smile reduction of a factor of 5 (e.g. from 3 mrad to 0.6 mrad), where 1 bar distance equals 2 mrad was achieved. Referring to FIG. 3B, a correction plate, as utilized in one embodiment of the pump laser system of the present invention, is mounted over the fast axis collimator lenses of a multi-bar stack.

In one embodiment of the pump laser system of the present invention, refractive or reflective optical elements in the external cavity magnify or otherwise transform the beam for the purpose of determining the wavelength range over which the wavelength selecting element will feed back power with high efficiency. In certain embodiments, these optical elements will comprise an afocal telescope consisting of converging elements at both ends. In certain embodiments, these optical elements will comprise a beam expander consisting of a diverging end and a converging end. In other embodiments, these elements will be cylindrical, acting only on the fast axis and not on the slow axis.

In certain embodiments, the external cavity may contain optical elements whose magnification of the fast axis may be three or greater, in other embodiments the magnification of the fast axis may be as high as ten or greater.

In one embodiment of the pump laser system of the present invention, a diffraction grating is oriented in the Littrow configuration with respect to the optical axis of the external cavity. In certain embodiments, a stepped mirror is positioned before the diffraction grating fashioned with a step size and reflection angle such that the optical path lengths, measured along the beams from the diode emitters in a bar to the row of points that those emitters illuminate on the grating, are made equal. In certain embodiments, the stepped mirror also reduces dark regions associated with the non-emitting regions of the diode stack which appear between the illuminated regions on the grating.

In one embodiment of the pump laser system of the present invention, refractive or reflective optical elements in the external cavity transform the beam for the purpose of limiting the angular range of the slow axis divergence over which the external cavity is capable of feeding back power with high efficiency. In certain embodiments, these optical elements will comprise an afocal telescope consisting of converging elements at both ends with a local point between those converging sections. In certain embodiments, these elements will be cylindrical, so that they act only on the slow axis and not on the fast axis. In some instances additional elements will be placed at this focal point to impinge on the beam and remove undesired portions, such elements including, but not limited to, an aperture for intercepting the unwanted portions from the beam, a refractive element for deflecting unwanted portions of the beam, a reflective element for reflecting away unwanted portions of the beam, or some combination, of these or other elements. In certain embodiments, additional optical elements may be placed at this focal point to reflect or deflect, desired portions of the beam, so that those portions are transmitted with high efficiency.

In certain embodiments, the external cavity may contain optical elements whose magnification of the slow axis may be four or less, in other instances the magnification of the slow axis may be as low as unity, or even lower.

In one embodiment of the pump laser system of the present invention, the bars of the stacks are oriented so that the fast axes of the emitters share the same plane as that formed by the intersections of the directions of propagation of the several beams from all the stacks. This orientation of the fast axis allows wavelength selection by the grating by rotating it by the Littrow angle about an axis perpendicular to this plane.

In one embodiment of the pump laser system of the present invention, the bars of the stacks are oriented so that the plane of the bars shares the plane that is formed by the intersections of the directions of the propagation of the several beams from all the stacks, and the fast axes of the emitters are perpendicular to this plane. This orientation of the fast axis does not facilitate wavelength selection by the grating by rotating it by the Littrow angle about an axis perpendicular to this plane. In some instances of this embodiment an additional optical element is inserted to rotate the image of the stack by 90% thereby interchanging the fast and slow axes.

In one embodiment of the pump laser system of the present invention, a rotation of the beam propagating toward the external cavity is incorporated, in whole or in part, and it accomplishes that rotation by reflecting the beam at least two times through two turning mirrors, so that it propagates along each of the three orthogonal axes of three-dimensional space.

In one embodiment of the pump laser system of the present invention, a rotation of the beam propagating toward the external cavity is incorporated, and it accomplishes that rotation by segmenting the merged beam from stacks with a large number of bars M into a number N of substacks, each with K bars, such that N×K=M, and delivering that beam to a stack of N rotation devices each of which is sized to accommodate K bars and separately rotate its beams.

Figure 4A:
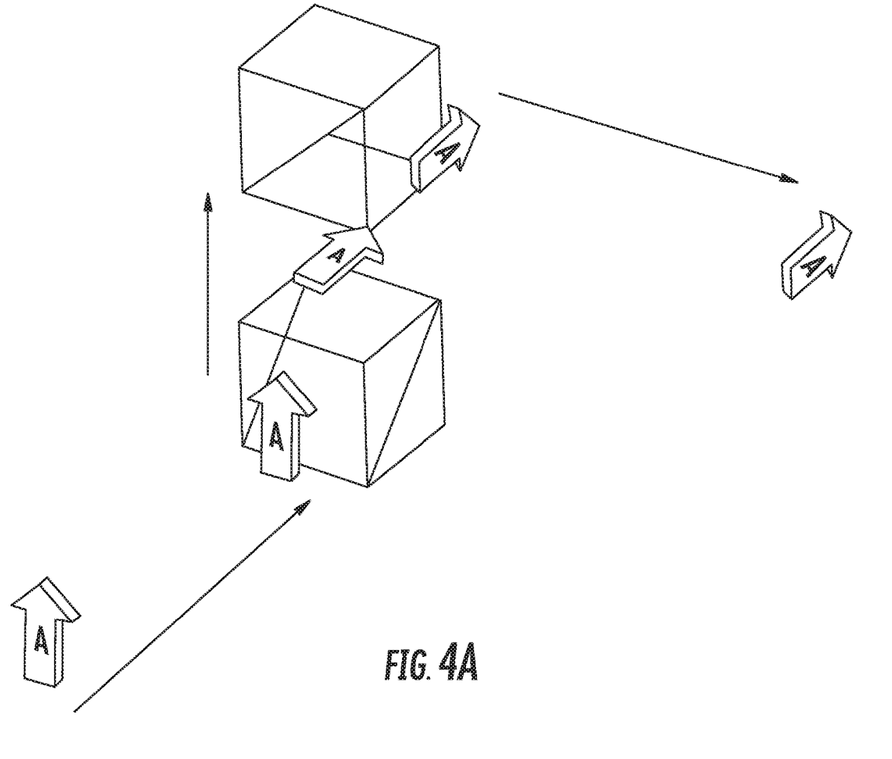
FIG. 4A shows one embodiment of a beam rotator of the pump laser system of the present invention.
Figure 4B:
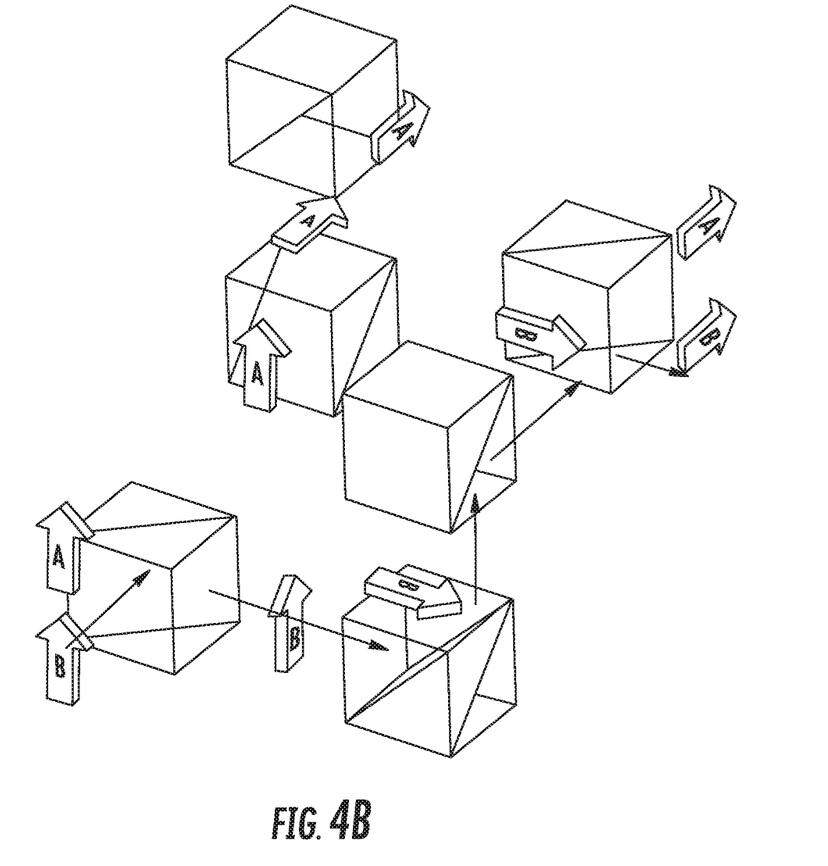
FIG. 4B shows one embodiment of a beam rotator of the pump laser system of the present invention.

Referring to FIG. 4A, a simple representation of beam rotation is shown. Referring to FIG. 4B, a representation of beam rotation is shown where one beam rotator is shifted diagonally by two additional turning mirrors to allow multiple beams to be rotated while remaining in a densely packed formation.

An example embodiment of the present invention utilizes diode bars approximately one centimeter in length with pitch spacing of 1.2 mm. In some instances these bars may be grouped into physical stacks of 8 bars, such that their output beam is approximately square. In some instances manufacturers can provide large stacks of these bars which can include 80 bars, 120 bars, or more. In some instances these bars may be grouped into 10 substacks, 15 substacks, or more. In some instances the merged beams from these bars propagating toward the external cavity are rotated by a stack of 10 rotation devices, 15 rotation devices, or more. In certain embodiments, custom diode arrays can be fabricate with their fast axis "horizontal" so their beams can go directly to the grating without rotation.

Figure 5A:
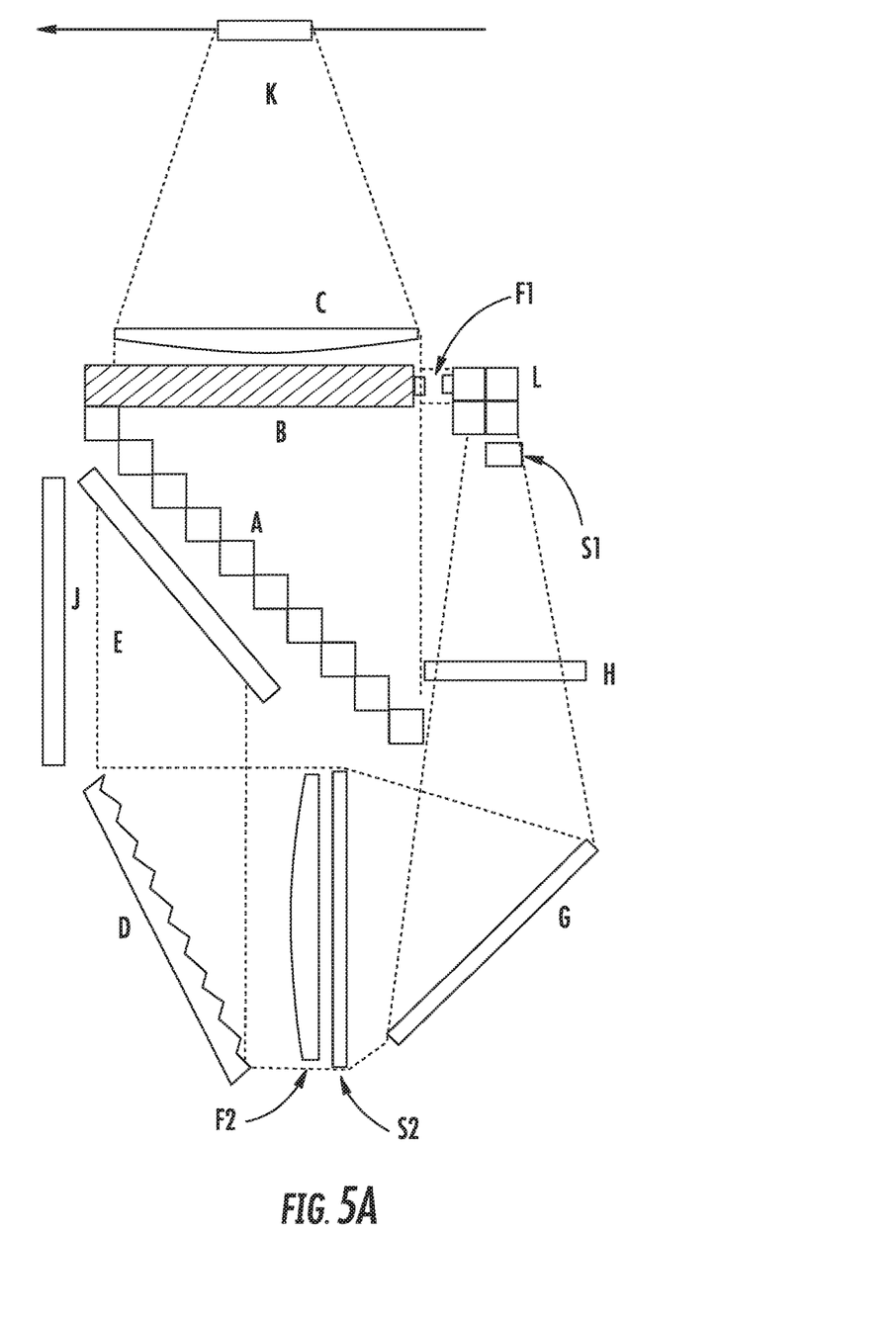
FIG. 5A is a schematic of one embodiment of the pump laser system of the present invention.

Referring to FIG. 5A, one embodiment of the pump laser system of the present invention is shown. More particularly, one embodiment of the system comprises diode bar stacks A, a splitter array B, output "condenser" lenses (separate cylindrical focal lengths for fast and slow axes) C, a stepped mirror which corrects path lengths, and reduces dark regions D, and a high-efficiency diffraction grating E that returns most of the light. Additionally, one embodiment of the system comprises F1, a diverging lens for last axis magnification, and F2, a converging cylinder with focal length ten times that of element "F1" to achieve magnification M=10 for the first axis. In certain embodiments, F1 could be either converging or diverging, but since intermediate focus is not needed for the fast axis, a diverging (concave) lens (or a cylindrical, aplanat doublet) was chosen. Next, turning mirrors (to fold the external cavity, minimize the physical package, and allow multiple units to pack together closely) G are present in certain embodiments, along with prisms H positioned at the slow axis focus to limit modes (reduce the slow axis divergence), and a slow axis converging element, S1, part of cylindrical lens afocal telescope in the slow axis (e.g. a cylindrical aplanat doublet); and a slow axis converging element, S2, part of cylindrical lens afocal telescope in the slow axis (e.g. a cylindrical aplanat doublet). In certain embodiments, two identical lenses achieve magnification M=1 in slow axis. Still referring to FIG. 5A, J is a beam dump for light coming forward off the grating, for safety, K is the focus of the output, and L is a beam rotator, as previously discussed, and as shown in FIGS. 4A and 4B.

Figure 5B:
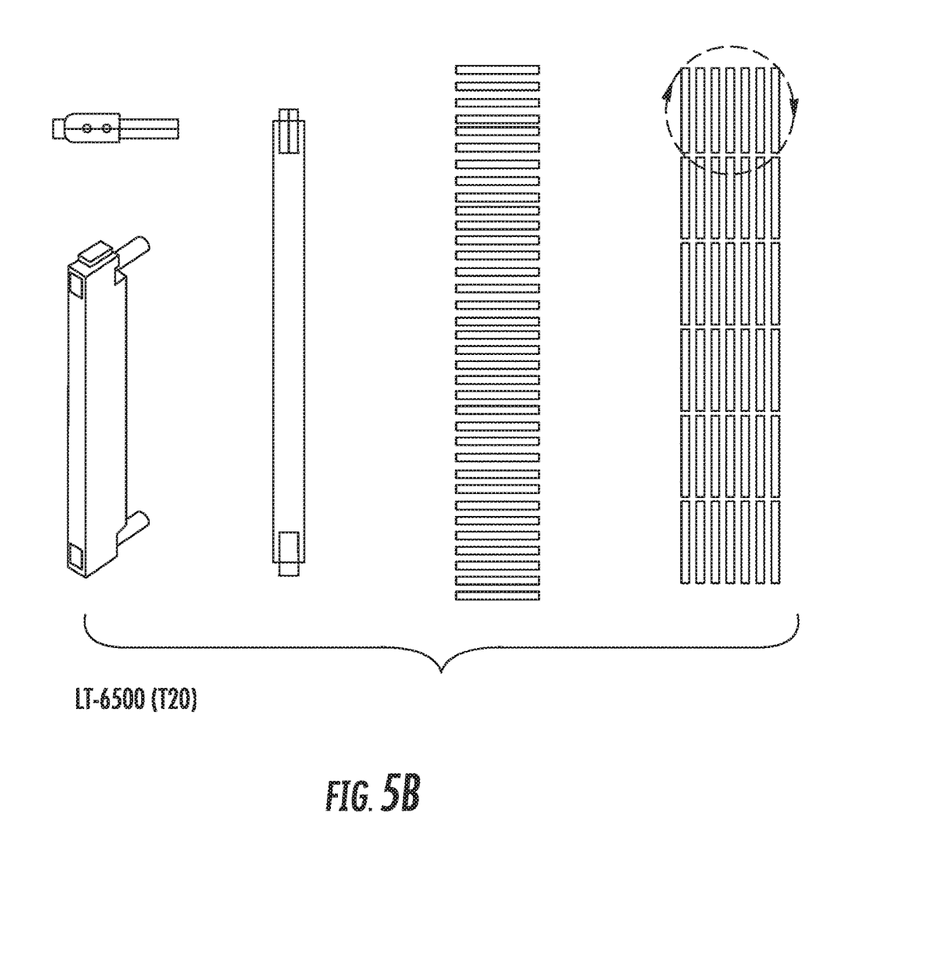
FIG. 5B is shows one embodiment of a stack used in one embodiment of the pump laser system of the present invention, as represented in FIG. 5A.

Referring to FIG. 5B, one embodiment of a stack used in one embodiment of the pump laser system of the present invention, as represented in FIG. 5A is shown.

Figure 6A:
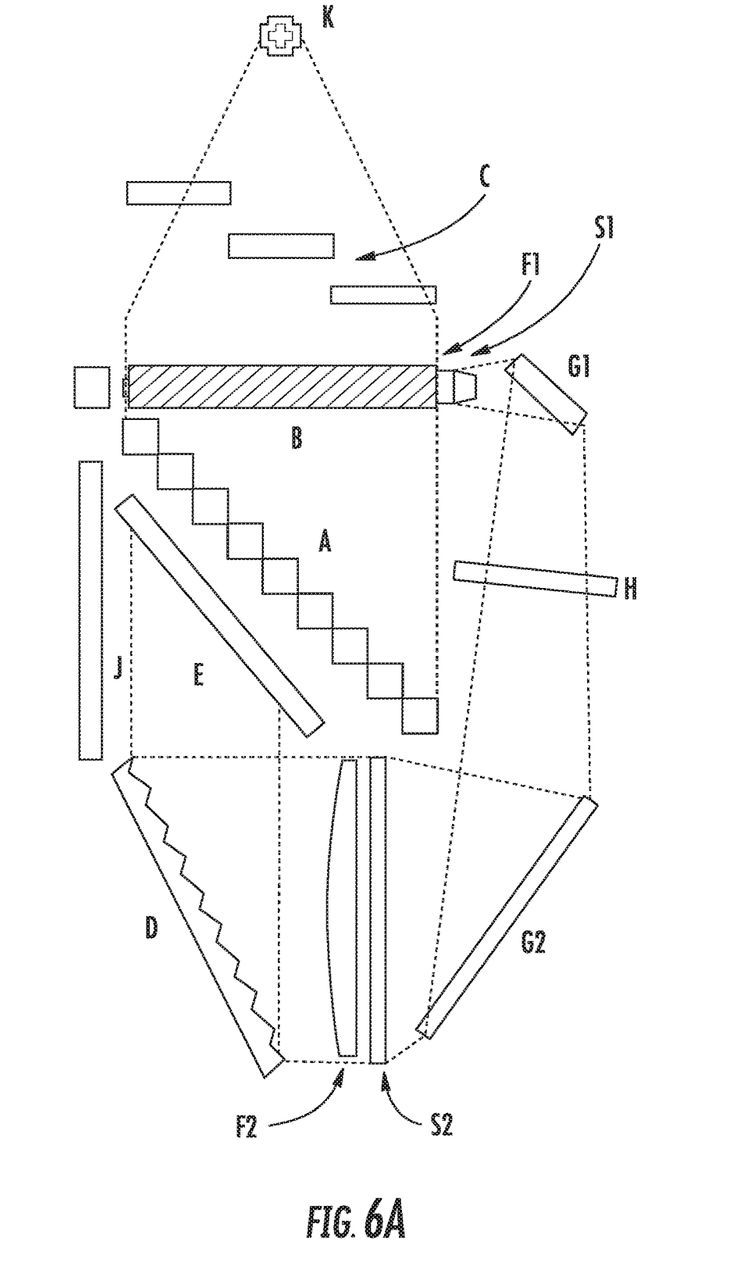
FIG. 6A is a schematic of one embodiment of the pump laser system of the present invention.

Referring to FIG. 6A, one embodiment of the pump laser system of the present invention is shown. More particularly, one embodiment of the system comprises diode bar stacks A, a splitter array B, output "condenser" lenses (separate cylindrical focal lengths for fast and slow axes), C, a stepped mirror which corrects path lengths, and reduces dark regions D, and a high-efficiency diffraction grating E that returns most of the light. Additionally, one embodiment, of the system comprises F1, a diverging lens for fast axis magnification, and F2, a converging cylinder with focal length ten times that of element "F1" to achieve magnification M=10 for the fast axis. In certain embodiments, F1 could be either converging or diverging, but since intermediate focus is not needed for the fast axis, a diverging (concave) lens (or a cylindrical aplanat doublet) was chosen. Next, turning mirrors (to fold the external cavity, minimize the physical package, and allow multiple units to pack together closely) G are present in certain embodiments, along with prisms, H, at slow axis focus to limit modes (reduce slow avis divergence), and a slow axis converging element, S1, part of cylindrical lens afocal telescope in the slow axis (e.g. a cylindrical aplanat doublet); and a slow axis converging element, S2, part of cylindrical lens afocal telescope in the slow axis (e.g. a cylindrical aplanat doublet). In certain embodiments, two identical lenses achieve magnification M=1 in slow axis. Still referring to FIG. 6A, J is a beam dump for light coming forward off the grating, for safety, and K is the focus of output.

Figure 6B:
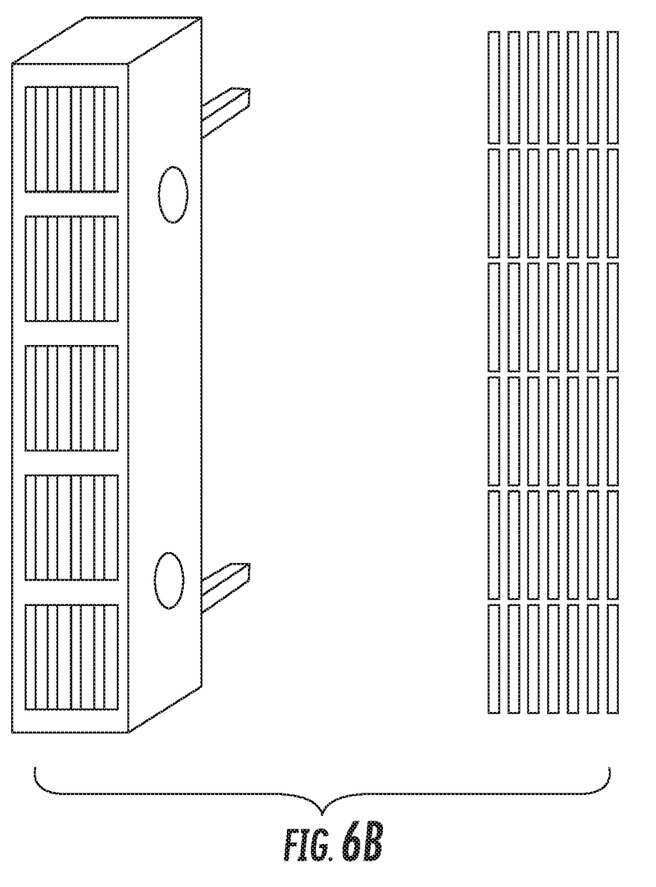
FIG. 6B shows one embodiment of a stack used in one embodiment of the pump laser system of the present invention, as represented in FIG. 6A.

Referring to FIG. 6B, one embodiment of a stack used in one embodiment of the pump laser system of the present invention, as represented in FIG. 6A is shown. In this embodiment, diode array stacks were chosen with their fast axis in the plane of the beams, so no beam rotator is employed.

In one embodiment of the pump laser system of the present invention, a 7.5 kW diode laser stack array was used to illuminate the DPAL cavity. The fast axes of the ten 780 nm 12-bar diode stacks were in the same plane as the several beams and fitted with FAC microlenses of approximately 0.6 mm focal length. Correction plates attached after the fast axis collimators reduced the divergence to under 1 mrad. Slow axis divergence was unmodified at 1.60 mr. In another embodiment, 780 nm bars of 10 mm length were run at 85 W, leading to ~750 W per 12 bar stack, with a 75% narrowing efficiency. There, a total of 7.5 kW was delivered to the beam compressor by the splitter/combiner array (which was 15 cm long). The cavity afocal telescope expanded the fast axis 10 times (lenses F1 and F2) via folding mirrors G1 and G2 (as seen in FIG. 6). In combination with the longer focal length fast axis collimators (focal length >1 mm), the wavelength narrowing capability was improved over 6 times (from 0.2 nm to roughly 0.033 nm) as compared to our previous systems. Slow axis gain in the cavity (e.g. cylindrical lenses S1 and S2) was 4, resulting in a 15 cm by 4 cm image on the high efficiency grating. The stepped mirror corrected the focus on the grating for each of the 12 bars. A beam dump was included for safety. In the intermediate focus of the cavity, a collimator reduced the slow axis divergence to 40 mrad by masking off the larger angles from the pure angular distribution at that point. The lasers were stimulated to amplify only the allowed angles. The beam compressor collected the fast axis with a single 500 mm cylinder lens, to a 0.5 mm dimension. The slow axis was imaged (enlarged by 2×) to a 2 cm dimension along the beam line by 3 separate cylinder tenses.

In another embodiment, of the pump laser system, of the present invention, a 75 kW assembly of diode array bar stack yields a ten-fold increase from the 7.5 kW power level by replacing the 12 bar stacks with 120 bar stacks (e.g. Lasertel T120) and by adding the unique beam rotator optic discussed previously. In one embodiment, the slow axes of the ten 780 nm 120-bar diode stacks are in the same plane of the several beams. A total of 75 kW was delivered to the output beam compressor by the splitter/combiner array (13 cm long), which had a vertical dimension equal to that of the laser stacks (e.g. 15 cm. The beam rotator divided up the fast axis into 15 eight bar parts and rotated them 90 degrees, using 60 1 cm reflectors (i.e. cubes or mirrors) with 100% reflecting diagonals. This unique assembly of elements also preserved the path length between the diode arrays and the external cavity optics, preserving its perfect focal properties. Downstream from there the fast axis was also in the plane. The latter is expanded 10 times in the cavity's afocal telescope (e.g. cylinder lenses F1 and F2) via a folding mirror G, as shown in FIG. 5. Slow axis gain in the cavity (cylindrical lenses S1 and S2, the latter 15 times subdivided) is unity, resulting in a 15 by 15 cm image on the high efficiency grating. The stepped mirror corrected the focus on the grating for each of the 8 bars. In the intermediate focus of the cavity, prisms refract large angle rays onto a beam dump, thereby reducing the slow axis divergence four-fold, from 160 mr to 40 mr. The single lens beam compressor collected both axes with an apheric 500 mm lens, to a dimension as small as 0.5 mm in the fast axis. The dimension along the beam line was determined by the slow axis divergence set by the collimating slit at the cavity's slow axis focus. When limited to 40 mrad, the illumination along the beam line is 20 mm (with a beam cross section 0.5×20 mm).

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention.

What is claimed:

1. A method for modifying the output beam parameters of a plurality of laser diode array sources, comprising:
   utilizing a single external cavity;
   directing a plurality of output beams of a same wavelength from a plurality of laser diodes through a power splitting array comprising a plurality of reflective or partially reflective elements oriented at about 45° with respect to a resultant beam of the same wavelength propagating toward the external cavity;
   merging and superimposing the plurality of output beams from the separate laser diode array sources, wherein the number of laser diode array sources is N and the number of reflective or partially reflective elements is N−1;
   directing the resultant beam towards the external cavity; and
   dividing and distributing the resultant beam returning from the external cavity thereby serving the plurality of laser diode array sources with seed photons for laser amplification.

2. The method for modifying the output beam parameters of a plurality of laser diode array sources of claim 1, wherein the plurality of laser diode array sources is represented by stacks of laser diode array bars.

3. The method for modifying the output beam parameters of a plurality of laser diode array sources of claim 1, further comprising the step of providing correction plates custom fitted for the plurality of laser diode array sources, wherein the correction plates are fabricated to improve the similarity of the illumination patterns of the beams from the separate laser diode array sources.

4. The method for modifying the output beam parameters of a plurality of laser diode array sources of claim 1, further comprising the step of equalizing the optical path length between the plurality of sources and the external cavity.

5. The method for modifying the output beam parameters of a plurality of laser diode array sources of claim 1, wherein there is a single turning mirror.

6. The method for modifying the output beam parameters of a plurality of laser diode array sources of claim 5, wherein a first laser diode array source has the power in its beam fully reflected toward the external cavity, and a second diode array source has ½ the power in its beam reflected towards the external cavity.

7. The method for modifying the output beam parameters of a plurality of laser diode array sources of claim 5, wherein a third laser diode array source would have ⅓ of its beam reflected toward the external cavity, and so on.

8. The method for modifying the output beam parameters of a plurality of laser diode array sources of claim 1, further comprising providing cylindrical optical elements.

9. The method for modifying the output beam parameters of a plurality of laser diode array sources of claim 8, further comprising modifying the fast-axis and slow-axis beam parameters independently using the cylindrical optical elements.

10. The method for modifying the output beam parameters of a plurality of laser diode array sources of claim 8, wherein the cylindrical optical elements are converging elements and form independent afocal telescopes.

11. The method for modifying the output beam parameters of a plurality of laser diode array sources of claim 9, wherein the magnification along the fast-axis is greater than the magnification along the slow axis.

12. The method for modifying the output beam parameters of a plurality of laser diode array sources of claim 9, wherein the cylindrical optical elements of the fast axis are first diverging and then converging, thereby forming a beam expander.

13. The method for modifying the output beam parameters of a plurality of laser diode array sources of claim 12, wherein one or more of the converging or diverging optical elements is an aplanat doublet.

14. The method for modifying the output beam parameters of a plurality of laser diode array sources of claim 1, further comprising the step of providing a grating at the Littrow angle for wavelength selection.

15. The method for modifying the output beam parameters of a plurality of laser diode array sources of claim 1, further comprising the step of providing an etalon for wavelength selection.

16. The method for modifying the output beam parameters of a plurality of laser diode array sources of claim 1, further comprising the step of providing an aperture in the external cavity to limit the divergence of the slow axis.

* * * * *